United States Patent
Ishimoto et al.

(10) Patent No.: US 7,405,995 B2
(45) Date of Patent: Jul. 29, 2008

(54) SEMICONDUCTOR STORAGE DEVICE

(75) Inventors: Seiichirou Ishimoto, Fukuoka (JP);
Kunio Takamatsu, Fukuoka (JP);
Naoya Kimura, Chiba (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 35 days.

(21) Appl. No.: 11/580,061

(22) Filed: Oct. 13, 2006

(65) Prior Publication Data
US 2007/0091708 A1    Apr. 26, 2007

(30) Foreign Application Priority Data
Oct. 17, 2005 (JP) ............... 2005-302094
Jun. 16, 2006 (JP) ............... 2006-167015

(51) Int. Cl.
*G11C 8/00* (2006.01)
*G11C 7/00* (2006.01)
(52) U.S. Cl. .................. 365/230.05; 365/194
(58) Field of Classification Search ............ 365/230.05, 365/194, 189.04, 189.05
See application file for complete search history.

(56) References Cited
U.S. PATENT DOCUMENTS
6,318,707 B1 * 11/2001 Hara et al. ............. 365/233.12
6,853,589 B2 * 2/2005 Tojima et al. .......... 365/189.05
7,061,822 B2 * 6/2006 Jung .................... 365/230.05

FOREIGN PATENT DOCUMENTS
JP    2001-094986    4/2001
JP    2001-101861    4/2001
JP    2002-108690    4/2002

\* cited by examiner

*Primary Examiner*—Anh Phung
*Assistant Examiner*—Andy Phung
(74) *Attorney, Agent, or Firm*—Studebaker & Brackett PC; Donald R. Studebaker (57) ABSTRACT

A semiconductor storage device has a simple control circuit that is added to a general one-port RAM. Taking a port-A clock signal as the reference, the control circuit generates a select signal that selects a port A during the period from elapse of a first predetermined time from the reference timing until a second predetermined time has elapsed and selects a port B during other periods. The control circuit generates a port-A delayed clock signal in the period in which the port A is selected. The control circuit generates a port-B delayed clock signal during the period from elapse of the second predetermined time until a third predetermined time has elapsed. The control circuit generates a conflict monitoring signal during the period from the reference timing until the second predetermined time has elapsed. When a clock signal is supplied from the port B while the conflict monitoring signal is being generated, the port-B delayed clock signal is masked while the conflict monitoring signal is being generated. After the conflict monitoring signal is stopped, the B-port delayed clock signal is generated as a port-B clock signal.

4 Claims, 4 Drawing Sheets

SEMICONDUCTOR STORAGE DEVICE

BACKGROUND OF THE INVENTION

1. Field of the Invention

The present invention relates to a semiconductor storage device that is used as an image display buffer memory and that is accessed asynchronously by a CPU (central processing unit) and a display device, for example.

2. Description of the Related Art

Conventionally, a driver controller that drives an organic EL (electronic luminescence) device or TFT-LCD (thin-film transistor liquid crystal display) or the like uses a dual port memory as an image processing memory for the reasons outlined below.

(1) The writing of image data to the driver controller and the reading of display data are implemented simultaneously.

(2) The power consumption of portable devices such as cellular phones must be reduced and, hence, access is made to an image processing memory by using asynchronous access or a low-speed clock. That is, a high-speed clock cannot be used.

(3) The CPU-system clock speed is different from image processing-system clock speed. Thus, timing conversion is required.

Japanese Patent Application Kokai (Laid Open) No. 2002-108690 discloses a multi-port memory device that intends to secure a large port number and suppress the power consumption by a simple constitution. This multi-port memory device does not have complex arbitration means.

This multi-port memory device fixes the timing of access and the access order to the DRAM (Dynamic Random Access Memory) for each system in one cycle of the sequence operation, performs serial-parallel conversion in sync with the write request timing by two serial-parallel conversion circuits, and temporarily stores the converted signals in the write buffers associated with the respective serial-parallel conversion circuits.

Also, data that are read from the DRAM are temporarily stored in two read buffers, converted to serial data by the parallel-serial conversion circuits associated the respective read buffers, and then supplied to outside after being delayed by a delay adjustment circuit to match the read request timing. In addition, the multiport memory device of Japanese Patent Application Kokai No. 2002-108690 separately supplies an operation clock to each system and stops the supply of the operation clock for a stopped system.

Japanese Patent Application Kokai No. 2001-101861 discloses a semiconductor storage device that aims to implement user-friendly multiple port functions with a reduced circuit scale.

This semiconductor storage device has a port expansion circuit that creates a first clock signal that corresponds with a clock signal supplied to a first input port for a single-port RAM (Random Access Memory) and a second clock signal with timing that is delayed with respect to the first clock signal. The port expansion circuit also produces a third clock signal from a clock signal that is supplied from the second input port. This port expansion circuit causes first and second latch circuits to retain address signals and data that are supplied from the address terminal and data input terminal of the second input port in accordance with the third clock signal. An address signal supplied via an address terminal of the first input port upon generation of the first clock signal is sent to the address terminal of the RAM, and a read signal from the selected memory cell is transmitted from the data output terminal. The writing is done when the address signal retained in the first latch circuit and write data held in the second latch circuit are sent to the address terminal of the RAM and the data input terminal in response to the second clock signal.

The multiport memory device of Japanese Patent Application Kokai No. 2002-108690 requires, for each system, a serial-parallel conversion circuit, a parallel-serial conversion circuit and a delay adjustment circuit. Accordingly, simplification of the circuitry can hardly be attained. In the semiconductor storage device of Japanese Patent Application Kokai No. 2001-101861, the first port is dedicated to the reading and the second port being is dedicated to the writing. Thus, this semiconductor storage device is not a full dual-port configuration.

SUMMARY OF THE INVENTION

An object of the present invention is to provide a full dual-port semiconductor storage device from a general one-port RAM.

According to a first aspect of the present invention, there is provided a semiconductor storage device that includes a selection circuit. When a first port is selected by a select signal, the selection circuit selects an address signal that is supplied to the first port, input data that is supplied to the first port, an operation permission signal that is supplied to the first port and a read/write control signal that is supplied to the first port. When a second port is selected by the select signal, the selection circuit selects an address signal supplied to the second port, input data that is supplied to the second port, an operation permission signal that is supplied to the second port and a read/write control signal that is supplied to the second port. Then, the selection circuit supplies the selected signals and data to a memory circuit. The semiconductor storage device also includes a first output buffer that retains output data that is read from the memory circuit in accordance with a first output clock signal and supplies the output data to the first port. The semiconductor storage device also includes a second output buffer that retains output data that is read from the memory circuit in accordance with a second output clock signal and supplies the output data to the second port. The semiconductor storage device also includes a control circuit that generates the select signal, the first output clock signal, the second output clock signal, and a memory clock signal for the memory circuit on the basis of a first clock signal supplied to the first port and a second clock signal supplied to the second port.

The control circuit has a first phase adjustment section, a second phase adjustment section, a phase comparison section, and a selection section.

The first phase adjustment section takes the rising edge or trailing edge of the first clock signal as the reference timing. The first phase adjustment section generates the select signal for selecting the first port during the period from elapse of a first predetermined time until a second predetermined time has elapsed. The first predetermined time is measured from the reference timing. The select signal from the first phase adjustment section selects the second port during other periods. The first phase adjustment section generates the first output clock signal together with a first delayed clock signal having a predetermined pulse width while the first port is being selected by the select signal. The first phase adjustment section generates a first delayed signal during the period from the second predetermined time until a third predetermined time has elapsed. The first phase adjustment section generates a second delayed clock signal having a predetermined pulse width while the first delayed signal is being generated. The first phase adjustment section generates a conflict monitoring signal that is activated during the period from the reference timing until the second predetermined time has elapsed.

The second phase adjustment section generates a second delayed signal a fixed time after the rising edge or trailing edge of the second clock signal, and generates a third delayed clock signal having a predetermined pulse width while the second delayed signal is being generated.

The phase comparison section, when the second delayed signal is generated while the conflict detection signal is being activated, generates a conflict detection signal from the start of generation of the second delayed signal until generation of the first delayed signal is stopped and generates an arbitration signal while the first delayed signal and the conflict detection signal are being generated.

The selection section has a first selector that selects the second delayed clock signal when the arbitration signal is being generated and selects the third delayed clock signal that is masked by the conflict detection signal when the arbitration signal is not being generated. The first selector issues the selected clock signal as the second output clock signal. The selection section also has a second selector that selects the first delayed clock signal when the first port is selected by the select signal and selects the second output clock signal when the second port is selected by the select signal. The second selector issues the selected clock signal as the memory clock signal.

Taking the first clock signal supplied from the first port as the reference timing, the first phase adjustment section produces the select signal for selecting the first port from the elapse of the first predetermined time to elapse of the second predetermined time, and otherwise for selecting the second port. The first phase adjustment section generates the first-port first delayed clock signal and the first output clock signal while the first port is being selected by the select signal. The first phase adjustment section generates the second-port second delayed clock signal from elapse of the second predetermined time to elapse of the third predetermined time. The first phase adjustment section generates a conflict monitoring signal from the reference timing to elapse of the second predetermined time. As a result, when the second clock signal is supplied from the second port during the period when the conflict monitoring signal is being generated, the second clock signal is masked while the conflict monitoring signal is being generated. After the conflict monitoring signal is stopped, the second delayed clock signal is issued as a second-port clock signal. Accordingly, by adding a simplified control circuit to a general one-port RAM, the access requests from the first and second ports which are made asynchronously can be arbitrated. Thus, a general one-port RAM can be used as a full two-port RAM.

These and other objects, aspects, and advantages of the present invention will become more completely evident upon reading the subsequent description of the preferred embodiment with reference to the attached drawings. However, the drawings merely serve to facilitate understanding of the invention and do not limit the scope of the present invention.

DETAILED DESCRIPTION OF THE INVENTION

An embodiment of the present invention will be described with reference to the drawings.

Figure 1:
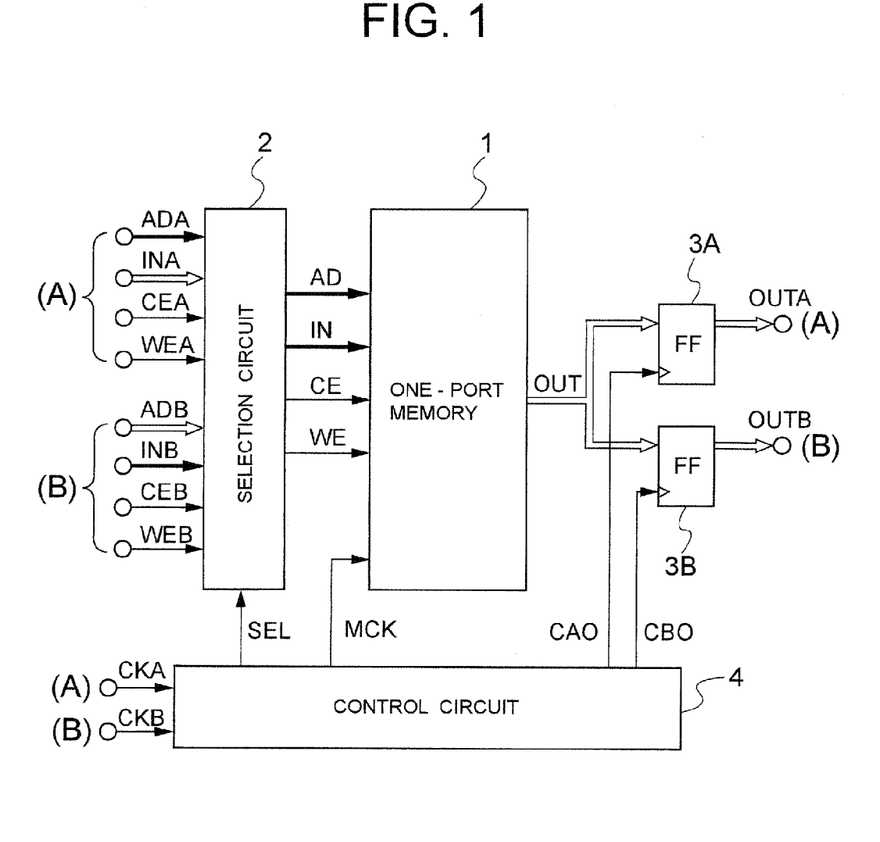
FIG. 1 is a schematic block diagram of a semiconductor storage device according to one embodiment of the present invention.

Referring to FIG. 1, the semiconductor storage device of this embodiment uses a general one-port memory 1 as a two-port memory. The semiconductor storage device includes the one-port memory 1, a selection circuit 2 that switches between input signals of a port A and input signals of a port B, and supplies the input signals to a one-port memory 1, output buffers 3A and 3B that retain the output data OUT that are read from the one-port memory 1 and supply the output data OUT to the ports A and B, and a control circuit 4 that controls the switching of the ports A and B.

The one-port memory 1 is selected by an operation permission signal CE and writes input data IN in accordance with the timing of the memory clock signal MCK to a storage area designated by the address signal AD when the write operation is designated by a read/write control signal WE. The one-port memory 1 is selected by the operation permission signal CE and reads data of a storage area designated by the address signal AD in accordance with the timing of the memory clock signal MCK when a read operation is designated by a read/write control signal WE and issues the data as output data OUT.

The selection circuit 2 switches between an address signal ADA, input data INA, an operation permission signal CEA and a read/write control signal WEA supplied to the port A, and an address signal ADB, input data INB, an operation permission signal CEB and a read/write control signal WEB supplied to the port B in accordance with the select signal SEL and feeds the selected signals and data as the address signal AD, input data IN, an operation permission signal CE, and a read/write control signal WE to the one-port memory 1.

The output buffers 3A and 3B are constituted by flip-flop (FF) circuits, for example. The output buffers 3A and 3B retain output data OUT provided from the one-port memory 1 in accordance with the timing of the output clock signals CAO and CBO and supply the retained data as the output data OUTA of the port A and the output data OUTB of the port B.

The control circuit 4 arbitrates so that there is no conflict between the operation of the port A and the operation of the port B on the basis of the clock signal CKA of the port A and the clock signal CKB of the port B and generates a memory clock signal MCK for the one-port memory 1, a select signal SEL for the selection circuit 2, and output clock signals CAO and CBO for the output buffers 3A and 3B.

Figure 2:
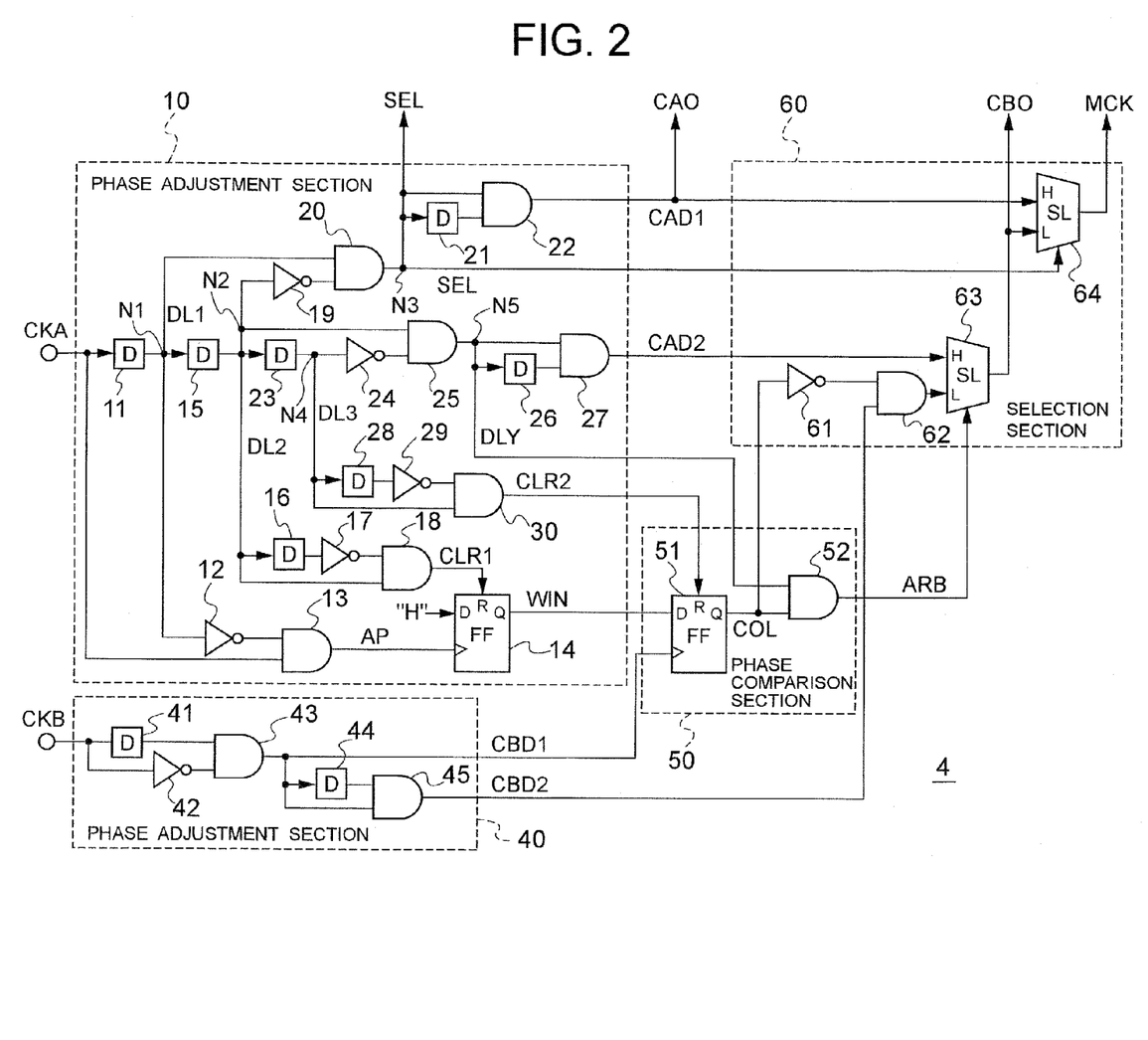
FIG. 2 is a circuit diagram of a control circuit shown in FIG. 1.

FIG. 2 is a circuit diagram that shows a configuration of the control circuit 4 in FIG. 1. In the control circuit 4, the frequency of the clock signal CKA of the port A is the same as or higher than the frequency of the clock signal CKB of the port B, and the port A has a higher priority than the port B.

The control circuit 4 has a phase adjustment section 10 that adjusts the phase of the clock signal CKA of the port A, another phase adjustment section 40 that adjusts the phase of the clock signal CKB of the port B, a phase comparison section 50 that detects a conflict by comparing the phases of the clock signals CKA and CKB, and a selection section 60 that generates the memory clock signal MCK and output clock signal CBO after arbitration to avoid a conflict between the clock signals.

The phase adjustment section 10 includes a delay element (D) 11 that delays the clock signal CKA supplied from the port A (of a cycle of 150 ns, for example) for a first predetermined time (20 ns, for example) and sends the delayed signal DL1 to a node N1. One input terminal of a two-input AND gate 13 is connected via an inverter 12 to the node N1, and the clock signal CKA is supplied to the other input terminal of the AND gate 13. As a result, a signal AP which is at an "H" (high) level for the delay time of the delay element 11 (first predetermined time) after the rising edge of the clock signal CKA which is the reference timing is generated from the output of the AND gate 13 and is supplied to the clock terminal of a flip-flop circuit 14.

A delay element 15 configured to generate a signal DL2 that is obtained by further delaying the signal DL1 (by 20 ns, for example) is connected to the node N1. The delay element 15 sends the signal DL2 to a node N2. One input terminal of a two-input AND gate 18 is connected via a delay element 16 (of 4 ns, for example) and inverter 17 to the node N2, and the other input terminal of the AND gate 18 is also connected to the node N2. As a result, a signal CLR1 which is at the "H" level for a fixed time of the delay element 16 from the rising edge of the delayed signal DL2 is produced from the output of the AND gate 18. The output of the AND gate 18 is connected to the reset terminal R of the flip-flop circuit 14. The data terminal D of the flip-flop circuit 14 is always given the "H" level signal and a conflict monitoring signal WIN which is at the "H" level as a result of being activated is generated from the output terminal Q of the flip-flop circuit 14 during a second period which is the total delay time of the delay elements 11 and 15 from the rising edge of the clock signal CKA.

One input terminal of a two-input AND gate 20 is connected to the node N2 via an inverter 19 and the other input terminal of the AND gate 20 is connected to the node N1. As a result, a select signal SEL which is at the "H" level for the delay time of the delay element 15 from the rising edge of the signal DL1 is sent to a node N3 which is the output of the AND gate 20, and the select signal SEL is supplied to the selection circuit 2 (FIG. 1) and a selector circuit 60.

One input terminal of a two-input AND gate 22 is connected to the node N3 via a delay terminal 21 (delay of 6 ns, for example) and the other input terminal of the AND gate 22 is connected to the node N3. As a result, a delayed clock signal CAD1 which is at the "H" level after being delayed by the delay time of the delay element 21 because select signal SEL is at the "H" level is produced from the output of the AND gate 22. The delayed clock signal CAD1 becomes the "L" (low) level at the same time as the select signal SEL is produced.

The delay time of the delay element 21 is the time for securing an operational margin until the one port memory 1 becomes able to operate normally with the address signal ADA and other signals and data supplied from the port A after the selection circuit 2 has been switched to the port A by means of the select signal SEL. The delayed clock signal CAD1 is supplied to the selection section 60 and is supplied to the output buffer 3A in FIG. 1 as an output clock signal CAO.

A delay element 23 that sends a signal DL3 obtained as a result of delaying the signal DL2 (by 20 ns, for example) to a node N4 is connected to the node N2. One input terminal of a two-input AND gate 25 is connected via an inverter 24 to the node N4. The other input terminal of the AND gate 25 is connected to the node N2. As a result, a delayed signal DLY which is at the "H" level for the delay time of the delay element 23 from the rising edge of the signal DL2 is sent to the node N5 at the output of the AND gate 25.

One input terminal of a two-input AND gate 27 is connected to the node N5 via a delay element 26 (of 6 ns, for example) and the other input terminal of the AND gate 27 is connected to the node N5. Accordingly, a delayed clock signal CAD2 which is at the "H" level after being delayed for the delay time of the delay element 26 because a delayed signal DLY is at the "H" level and which is at the "L" level at the same time as the delayed signal DLY is generated from the output of the AND gate 27. The delayed clock signal CAD2 is used as the clock signal of the port B after temporarily interrupting the operation of the port B when there is a conflict between the clock signals CKA and CKB of the ports A and B. The delay time of the delay element 26 is a time for securing an operational margin until the one port memory 1 becomes able to operate normally with the address signal ADB and other signals and data supplied from the port B after the selection circuit 2 has been switched to the port B by means of the select signal SEL.

One input terminal of a two-input AND gate 29 is connected via a delay element 28 (of 4 ns, for example) and inverter 29 to the node N4 and the other input terminal of the AND gate 29 is connected to the node N4. As a result, a signal CLR2 which is at the "H" level for the delay time of the delay element 28 from the rising edge of the signal DL3 is generated from the output of the AND gate 29. The signal CLR2 is supplied to the phase comparator 50.

The phase adjustment section 40 includes a delay element 41 that delays the clock signal CKB supplied from the port B (by 20 ns, for example) and an inverter 42 that inverts the clock signal CKB. The outputs of the delay element 41 and inverter 42 are connected to the respective inputs of a two-input AND gate 43. When the clock signal CKB is at the "L" level, a delayed signal CBD1 which is at the "H" level for the delay time of the delay element 41 is generated from the output of the AND gate 43.

The delayed signal CBD1 is supplied to one input terminal of a two-input AND gate 45 via the delay element 44 (of 6 ns, for example) and also supplied to the other input terminal of the AND gate 45, and a delayed clock signal CBD2 is generated from the output of the AND gate 45. The delayed clock signal CBD2 is a signal that is at the "H" level after being delayed by the delay time of the delay element 44 when the delayed signal CBD1 becomes an "H" level signal and which is at the "L" level at the same time as the delayed signal CBD1. The delay time of the delay element 44 is a time for securing an operational margin until the one port memory 1 becomes able to operate normally with the address signal ADB and other signals and data supplied from the port B after the selection circuit 2 has been switched to the port B by means of the select signal SEL.

The phase comparator 50 has a flip-flop circuit 51 whose data terminal D receives the conflict monitoring signal WIN generated by the phase adjustment section 10. The delayed signal CBD1 generated by the phase adjustment section 10 is supplied to the clock terminal of the flip-flop circuit 51. A signal CLR2 is supplied from the phase adjustment section 10 to the reset terminal R of the flip-flop circuit 51. A conflict detection signal COL which is at the "H" level only when the delayed signal CBD1 has risen while the conflict monitoring signal WIN is at the "H" level is generated from the output terminal Q of the flip-flop circuit 51. The conflict detection signal COL is at the "L" level when the reset is made by the signal CLR2. One input terminal of a two-input AND gate 52 is connected to the output terminal Q of the flip-flop circuit 51, and the delayed signal DLY from the phase adjustment section 10 is supplied to the other input terminal of the AND gate 52. As a result, an arbitration signal ARB which is at the "H" level with the same timing as the delayed signal DLY is generated from the AND circuit 52 only when the delayed signal CBD1 rises while the conflict monitoring signal WIN is at the "H" level.

The selection section 60 has an inverter 61 that inverts the conflict detection signal COL of the phase comparison section 50. The output of the inverter 61 is connected to the first input terminal of the two-input AND gate 62 and the delayed clock signal CBD2 generated by the phase adjustment section 40 is supplied the other input terminal of the AND gate 62. Thus, the delayed clock signal CBD2 is masked while the conflict detection signal COL is being generated. The output terminal of the AND gate 62 is connected to the input terminal L of a selector 63, and the delayed clock signal CAD2 generated by the phase adjustment section 10 is supplied to the input terminal H of the selector 63. The selector 63 selects the input terminal L when the arbitration signal ARB supplied from the phase comparison section 50 to the control terminal is an "L" level signal and selects the input terminal H when the arbitration signal ARB is an "H" level signal. The selector 63 issues the signal of the selected input terminal as the output clock signal CBO. The output clock signal CBO is supplied to the input terminal L of a selector 64 and is supplied to the output buffer 3B in FIG. 1.

The delayed clock signal CAD1 generated by the phase adjustment section 10 is supplied to the input terminal H of the selector 64. The selector 64 selects the input terminal L when the select signal SEL supplied from the phase adjustment section 10 to the control terminal is at the "L" level, and selects the input terminal H when the select signal SEL is at the "H" level. The selector 64 sends the signal of the selected input terminal as the memory clock signal MCK to the one-port memory 1 in FIG. 1.

Figure 3:
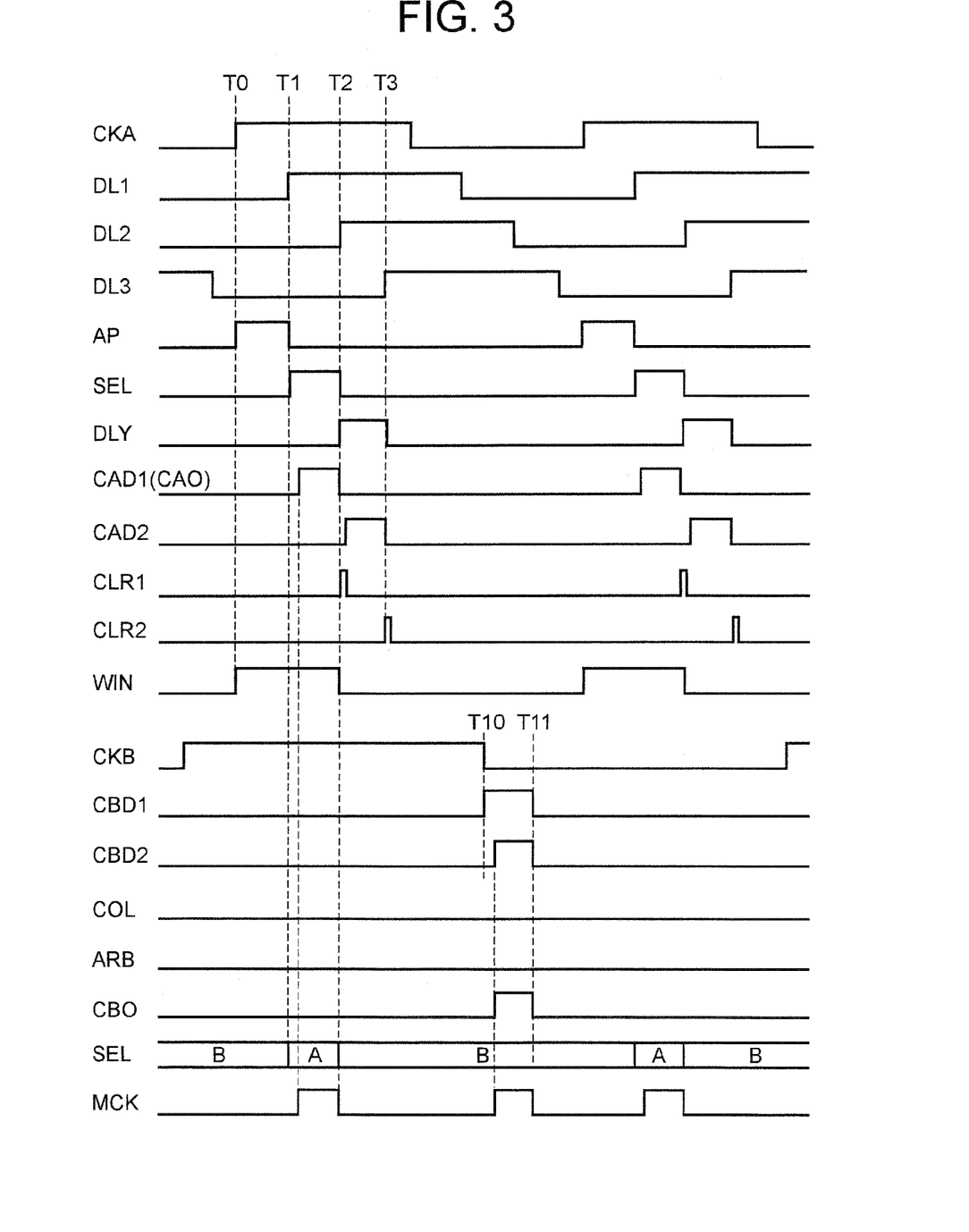
FIG. 3 is a signal waveform diagram showing the operation of the control circuit in FIG. 1 when there is no conflict between two ports of the semiconductor storage device.
Figure 4:
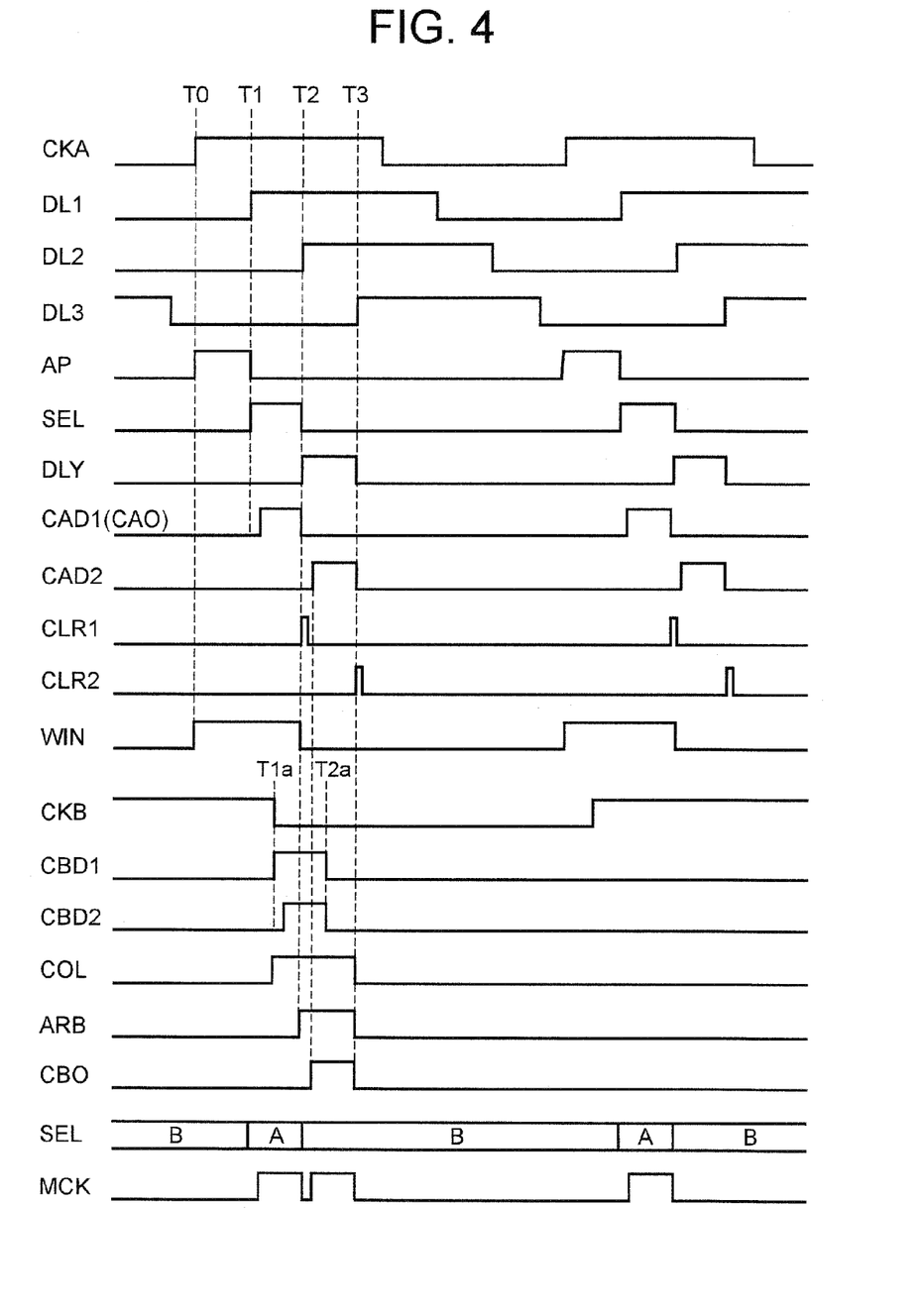
FIG. 4 is a signal waveform diagram showing the operation of the control circuit in FIG. 1 when there is a conflict between the two ports of the semiconductor storage device.

FIGS. 3 and 4 are signal waveform diagrams that show the operation of the control circuit 4 in FIG. 1. FIG. 3 shows a case where there is no conflict between the ports A and B, and FIG. 4 shows a case where there is a conflict between the ports A and B. The operation of the semiconductor storage device of FIG. 1 will be described hereinbelow with the focus on the control circuit 4 in FIG. 2 with reference to FIGS. 3 and 4.

As shown in FIGS. 3 and 4, the clock signal CKA supplied to the port A is sequentially delayed by the vertically connected delay elements 11, 15 and 23 of the phase adjustment section 10 in FIG. 2. When the clock signal CKA of the port A rises at time T0, the signal DL1 of the node N1 rises at time T1 upon elapse of the first predetermined time from time T0. Time T0 is taken as the reference timing. A signal DL2 of the node N2 rises at time T2 upon elapse of the second predetermined time from time T0. A signal DL3 of the node N4 rises at time T3 upon elapse of the third predetermined time from T0.

Therefore, a signal AP that is generated from the AND gate 13 is at the "H" level during the period from time T0 to time T1. The select signal SEL that is generated from the AND gate 20 is at the "H" level during the period from time T1 to time T2. The delayed signal DLY that is generated from the AND gate 25 is at the "H" level during the period from time T2 to time T3. Signals CLR1 and CLR2 having a narrow pulse width are sequentially generated from the AND gates 18 and 30 at times T2 and T3.

As a result, the delayed clock signal CAD1 that is generated from the AND gate 22 after being delayed for the delay time of the delay element 21 from the rising edge of the select signal SEL at time T1 becomes an "H" level signal, and the delayed clock signal CAD2 that is generated from the AND gate 27 after being delayed for the delay time of the delay element 26 from the rising edge of the delayed signal DLY at time T2 becomes an "H" level signal. The conflict monitoring signal WIN is generated by the flip-flop circuit 14 at the "H" level during the period from time T0 to time T2.

As shown in FIG. 3, when there is no change in the rise or fall of the clock signal CKB of the port B while the conflict monitoring signal WIN is at the "H" level, the delayed signal CBD1 and delayed clock signal CBD2 generated from the phase adjustment section 40 during the period from time T0 to time T2 are both at the "L" level. Hence, the conflict detection signal COL and arbitration signal ARB which are generated from the phase comparison section 50 are both at the "L" level. As a result, the delayed clock signal CBD2 is selected by the selector 63 of the selection section 60 and sent to the selector 64 and output buffer 3B as an output clock signal CBO.

When the select signal SEL is at the "H" level during the period from time T1 to time T2, the selection circuit 2 selects the address signal ADA, input data INA, operation permission signal CEA and read/write control signal WEA of the port A and supplies the selected signals and data as the address signal AD, input data IN, operation permission signal CE, and read/write control signal WE to the one port memory 1. The delayed clock signal CAD1 is selected by the selector 64 of the selection section 60 and supplied to the one port memory 1 as the memory clock signal MCK. In addition, the delayed clock signal CAD1 is supplied to the output buffer 3A as the output clock signal CAO.

As a result, the one port memory 1 performs a write and read operation on the basis of the address signal ADA, the operation permission signal CEA, read/write control signal WEA, and clock signal CKA which are supplied from the port A during the period from time T1 to time T2, i.e., while the select signal SEL is at the "H" level.

During the period in which the select signal SEL is at the "L" level, i.e., during the period other than from time T1 to T2, the address signal ADB, input data INB, operation permission signal CEB, and read/write control signal WEB of the port B are selected by the selection circuit 2 in accordance with the select signal SEL and supplied to the one port memory 1 as the address signal AD, input data IN, operation permission signal CE, and read/write control signal WE. As indicated from time T10 to time T11 in FIG. 3, the delayed clock signal CBD2 generated on the basis of the timing of the trailing edge of the clock signal CKB is selected by the selectors 63 and 64 of the selection section 60 and supplied to the one port memory 1 as the memory clock signal MCK. Hence, during the period when the select signal SEL is at the "L" level, the one port memory 1 performs read and write operations on the basis of the address signal ADB, operation permission signal CEB, read/write control signal WEB and clock signal CKB supplied from the port B.

On the other hand, as shown in FIG. 4, when the clock signal CKB of the port B falls while the conflict monitoring signal WIN is at the "H" level (time T1a), the delayed signal CBD1 generated from the AND gate 43 of the phase adjustment section 40 is at the "H" level during the period from time T1a to time T2a, and the delayed clock signal CBD2 that is generated from the AND gate 45 after being delayed for the delay time of the delay element 44 is at the "H" level. Therefore, the conflict detection signal COL generated from the flip-flop circuit 51 of the phase comparison section 50 is at the "H" level during the period from time T1a to time T3, and the arbitration signal ARB generated by the AND gate 52 is at the "H" level during the period from time T2 to time T3.

As a result, the delayed clock signal CAD1 is selected by the selector 64 and issued as the memory clock signal MCK during the period from time T1 to time T2 in which the select signal SEL is at the "H" level and the port A is selected by the selection section 60. Because the delayed clock signal CBD2 is masked by the conflict detection signal COL that has been inverted by the inverter 61 during the period from time T1 to time T2, the feeding of the output clock signal CBO to the output buffer 3B is also stopped. At time T2, when the select signal SEL is at the "L" level and the port B is selected, the delayed clock signal CAD2 generated during the period from time T2 to time T3 is selected by the selector 63 and supplied to the output buffer 3B as the output clock signal CBO, and the output clock signal CBO (that is, the delayed clock signal CAD2) is selected by the selector 64 and supplied to the one port memory 1 as the memory clock signal MCK.

As described above, the semiconductor storage device of this embodiment includes the phase adjustment section 10 that takes the rising edge of the clock signal CKA supplied from the port A as the reference timing. The phase adjustment section 10 generates a select signal SEL that selects the port A during the period from elapse of the first predetermined time from the reference timing until the second predetermined time has elapsed, and selects the port B during other periods. The phase adjustment section 10 generates a port-A delayed clock signal CAD1 and output clock signal CAO in the period in which the port A is selected by the select signal SEL. The phase adjustment section 10 generates a port-B delayed clock signal CAD2 during the period from elapse of the second predetermined period until a third predetermined time has elapsed. The phase adjustment section 10 generates a conflict monitoring signal WIN during the period from the reference timing until the second predetermined time has elapsed. As a result, when the clock signal CKB is supplied from the port B while the conflict monitoring signal WIN is generated, the delayed clock signal CBD2 generated on the basis of the clock signal CKB is masked while the conflict monitoring signal WIN is generated. The delayed clock signal CAD2 is generated as a port-B clock signal after the conflict monitoring signal WIN is stopped. Accordingly, by adding the simplified control circuit 4 to a general one-port memory 1, the access requests supplied asynchronously from the ports A and B can be arbitrated and the one-port memory 1 can be used as a full two-port RAM.

Furthermore, because the control circuit 4 does not use a high-speed clock, the power consumption can be suppressed.

The present invention is not limited to the above described embodiment and a variety of modifications are possible. The following modifications can be made, for example.

(a) The illustrated and described circuit constitution of the control circuit 4 is an example and can be replaced with circuits with the same functions. For example, the same operation can be implemented by removing the inverter 12 and AND gate 13 of the phase adjustment section 10 and causing the clock signal CKA to be directly supplied to the clock terminal of the flip-flop circuit 14.

(b) The phase adjustment section 10 takes the timing of the rising edge of the clock signal CKA of the port A as the reference timing in the above described embodiment, but the timing of the trailing edge of the clock signal CKA may be used instead of the rising edge of the clock signal CKA. The phase adjustment section 40 generates a delayed clock signal CBD2 on the basis of the timing of the trailing edge of the clock signal CKB of the port B in the above described embodiment but the rising edge timing of the clock signal CKB may be used instead.

(c) The delay time of the delay element 11 mentioned in the above described embodiment is an example. In practice, the delay time of the delay element 11 is set to a value that secures timing that allows the one-port memory 1 to operate appropriately.

This application is based on Japanese Patent Applications Nos. 2005-302094 and 2006-167015 and the entire contents of these two Japanese applications are incorporated herein by reference.

What is claimed is:

1. A semiconductor storage device, comprising:
   a selection circuit that, when a first port is selected by a select signal, selects an address signal supplied to the first port, input data supplied to the first port, an operation permission signal supplied to the first port and a read/write control signal supplied to the first port and which, when a second port is selected by the select signal, selects an address signal supplied to the second port, input data supplied to the second port, an operation permission signal supplied to the second port and a read/write control signal supplied to the second port, so as to send the selected address signal, input data, operation permission signal and read/write control signal to a memory circuit;
   a first output buffer for retaining first output data that is read from the memory circuit in accordance with a first output clock signal and for supplying the first output data to the first port;
   a second output buffer for retaining second output data that is read from the memory circuit in accordance with a second output clock signal and for supplying the second output data to the second port; and
   a control circuit that generates the select signal, the first output clock signal, the second output clock signal, and a memory clock signal for the memory circuit on the basis of a first clock signal supplied to the first port and a second clock signal supplied to the second port,
   wherein a rising edge or trailing edge of the first clock signal is taken as a reference timing, a first predetermined time is measured from the reference timing, a second predetermined time greater than the first predetermined time is measured from the reference timing and a third predetermined time greater than the second predetermined time is measured from the reference timing, and
   wherein the control circuit includes:
   a first phase adjustment section that generates the select signal for selecting the first port during a first period from elapse of the first predetermined time until the second predetermined time has elapsed and for the selecting the second port during other periods, generates the first output clock signal together with a first delayed clock signal having a first predetermined pulse width during a second period when the first port is selected by the select signal, generates a first delayed signal during a third period from elapse of the second predetermined time until the third predetermined time has elapsed, generates a second delayed clock signal having a second predetermined pulse width while the first delayed signal is being generated, and generates a conflict monitoring signal that is activated during a fourth period from the reference timing until the second predetermined time has elapsed;
   a second phase adjustment section that generates a second delayed signal a fixed time after a rising edge or trailing edge of the second clock signal and generates a third delayed clock signal having a third predetermined pulse width while the second delayed signal is being generated;

a phase comparison section that, when the second delayed signal is generated while the conflict monitoring signal is being activated, generates a conflict detection signal during a fifth period from a start of generation of the second delayed signal until generation of the first delayed signal is stopped and generates an arbitration signal while the conflict detection signal and the first delayed signal are being generated; and a selection section that includes a first selector for selecting the second delayed clock signal when the arbitration signal is being generated and for selecting the third delayed clock signal masked by the conflict detection signal when the arbitration signal is not being generated, so as to issue the selected clock signal as the second output clock signal, and a second selector for selecting the first delayed clock signal when the first port is selected by the select signal and for selecting the second output clock signal when the second port is selected by the select signal, so as to issue the selected clock signal as the memory clock signal.

2. The semiconductor storage device according to claim 1, wherein the first output buffer is a flip-flop circuit and the second output buffer is another flip-flop circuit.

3. The semiconductor storage device according to claim 1, wherein a frequency of the first clock signal is the same as or higher than a frequency of the second clock signal, and the first port has a higher priority than the second port.

4. The semiconductor storage device according to claim 1, wherein the first clock signal and the second clock signal are not high-speed clock signals.

* * * * *